United States Patent [19]
Haughton et al.

[11] Patent Number: 5,982,627
[45] Date of Patent: Nov. 9, 1999

[54] CARD RETENTION LATCH INCLUDING CARD GUIDE AND LOCKING FRAME

[75] Inventors: Peter Torgil Haughton, Chapel Hill; Rodrigo Samper; Joel Edwin Walker, both of Raleigh; Jacklin Ann Adams, Cary; Timothy S. Farrow, Apex, all of N.C.

[73] Assignee: International Business Machines Corporation, Armonk, N.Y.

[21] Appl. No.: 09/078,986

[22] Filed: May 14, 1998

[51] Int. Cl.⁶ .................................................. H05K 7/12
[52] U.S. Cl. .......................... 361/759; 361/756; 361/801; 361/802; 211/41.17; 206/706
[58] Field of Search ..................... 361/752, 756, 361/759, 796, 801, 802; 211/41.17; 206/706–708; 70/85, 95; 312/215, 216

[56] References Cited

U.S. PATENT DOCUMENTS

| 5,544,006 | 8/1996 | Radloff et al. | 361/756 X |
| 5,673,175 | 9/1997 | Carney et al. | 361/759 X |
| 5,715,146 | 2/1998 | Hoppal | 361/796 |

*Primary Examiner*—Leo P. Picard
*Assistant Examiner*—Jayprakash N. Gandhi
*Attorney, Agent, or Firm*—George E. Grosser

[57] ABSTRACT

A frame is provided at the front end of the adapter card receiving area of a personal computer which includes card guides, a flex bar for retaining inserted cards and a dual function blocking member which has opposed blocking surfaces so arranged that they retain the locking bar respectively in a lock and open position respectively and transition between the two with simple, one-hand activation.

5 Claims, 4 Drawing Sheets

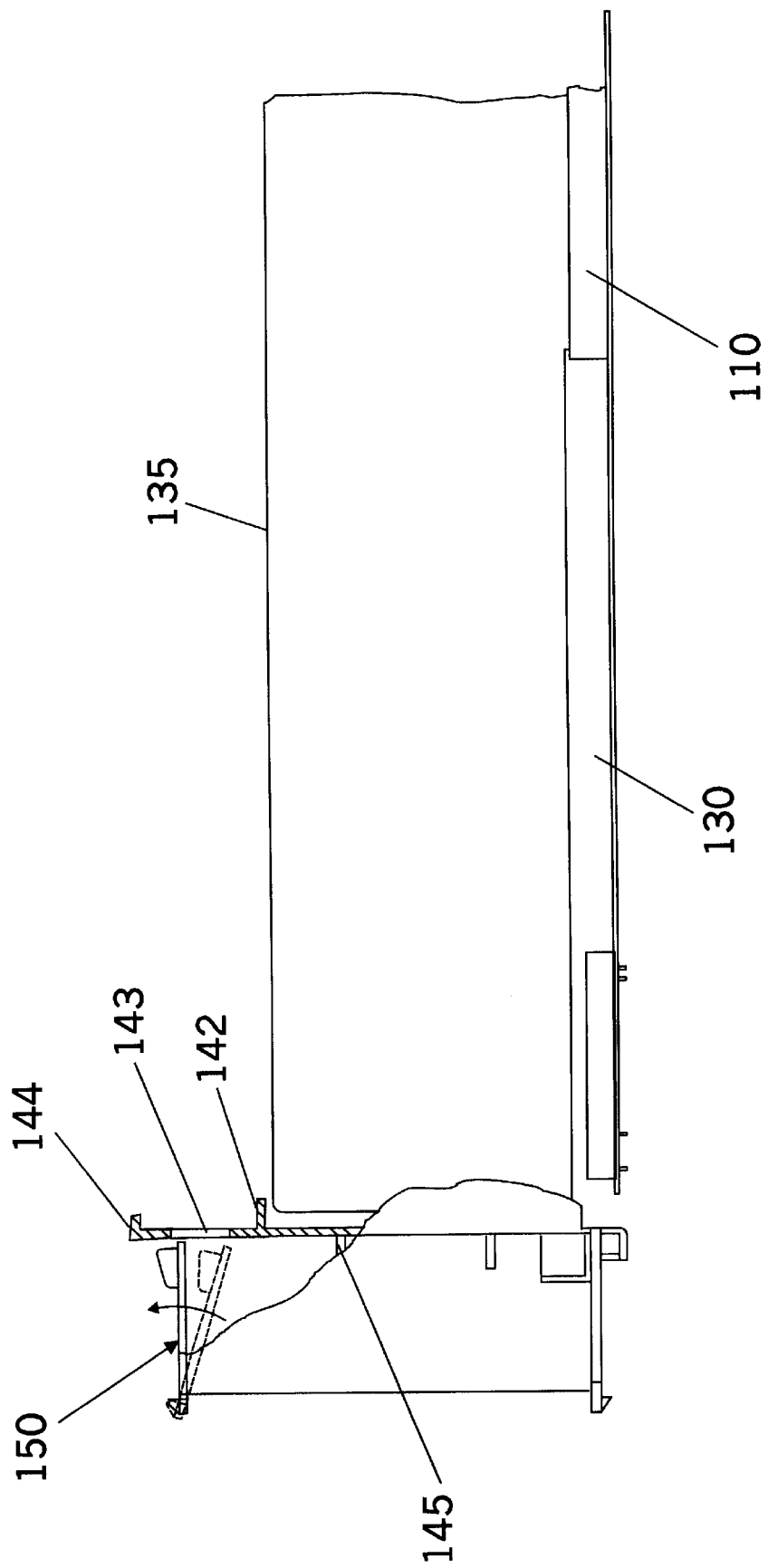

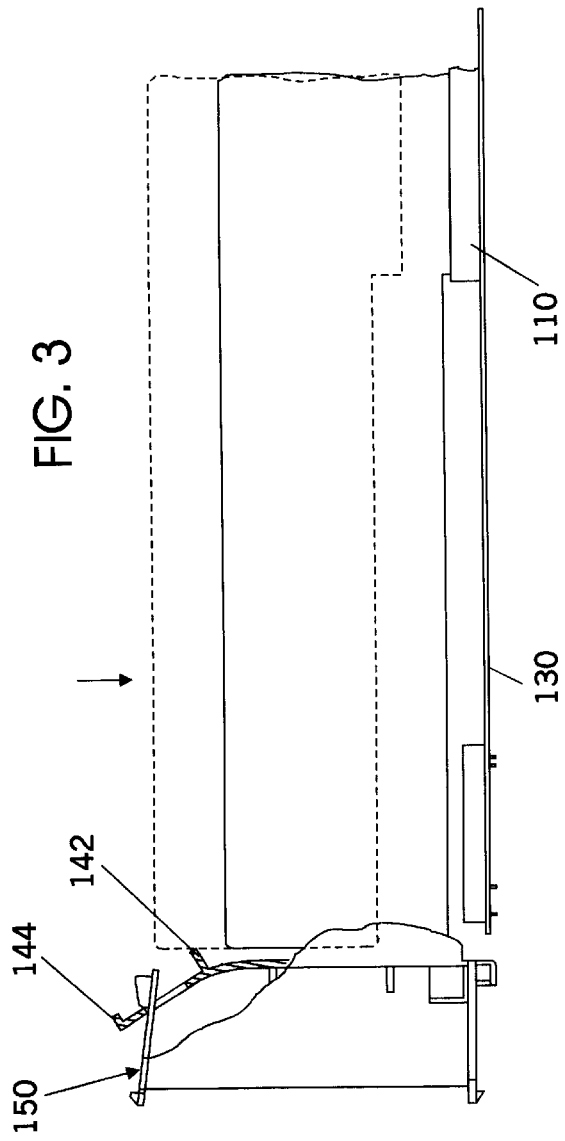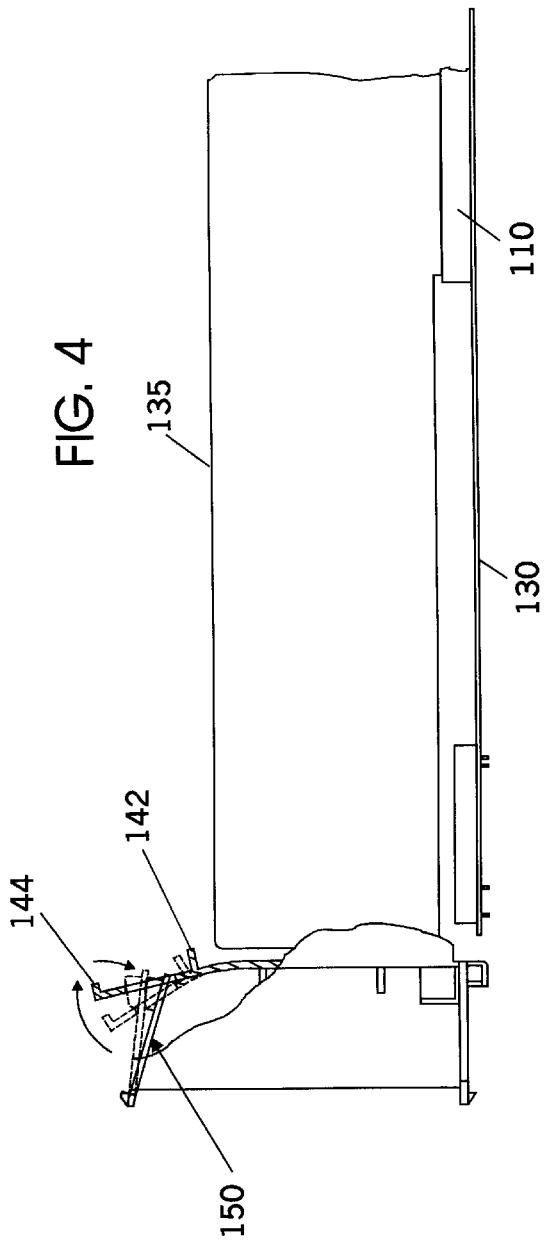

CARD RETENTION LATCH INCLUDING CARD GUIDE AND LOCKING FRAME

BACKGROUND OF THE INVENTION

1. Field of the Invention

The present invention relates, in general, to personal computers adapted to receive adapter cards and, in particular, to apparatus for facilitating the installation and removal of adapter cards.

1. Background

Most personal computers are designed to receive adapter cards to permit flexibility of selection of subsystems such as those for video, sound or telephone connection. The mechanics of receiving adapter cards has not changed significantly from that employed in the original IBM personal computers introduced in the 1980 time frame. One end of the elongate card has an L-shaped metal bracket with a tab at one end and a notch at the other end in the short leg of the L.

The tab is received in a slot and the short leg of the L rests on a frame member. A small screw passes through the notch into the frame member to hold the card in place, At the other end of the card, for long cards, the card edge is retained on either side by projecting guide ribs.

While this arrangement has been satisfactory the cards do come out enough to cause problems—especially during shipping. This is a significant problem as end users expect a working system and do not expect or wish to open the covers and press adapter cards into place.

In some cases displaceable blocking ribs have been placed above the card guides to restrain the cards but these have proven only partially effective and are inconvenient to use. With such ribs, it is difficult to use both hands to insert or remove a card.

SUMMARY OF THE INVENTION

According to the invention, a flexible member has two sets of blocking edges and provides two position control of a member having a card restraining rib. It is recognized that by restraining the ribbed member in a withdrawn position on the one hand and to a card blocking position on the other, it is possible to free a single service provider to use both hands to manipulate adapter cards all without need of special tools like wedges or clamps. Furthermore the card retainer is blocked from moving out of position when the flex member is in the normal use position. Hence the flex member defines a service and a secured position for the ribbed card retainer.

BRIEF DESCRIPTION OF THE DRAWINGS

The invention will now be described in detail with reference to the drawings wherein:

FIG. 2 is a right side view of a card frame according to the invention with the lock bar section cut away to emphasize the lock bar in the normal or blocking position;

FIG. 3 is similar to FIG. 2 but shows the lock bar flexed and held out of the way to allow two handed card insertion card insertion; and FIG. 4 is similar to FIGS. 2 and 3 but shows the release of the lock bar to move to the card blocking position.

DESCRIPTION OF THE PREFERRED EMBODIMENT

Figure 1:
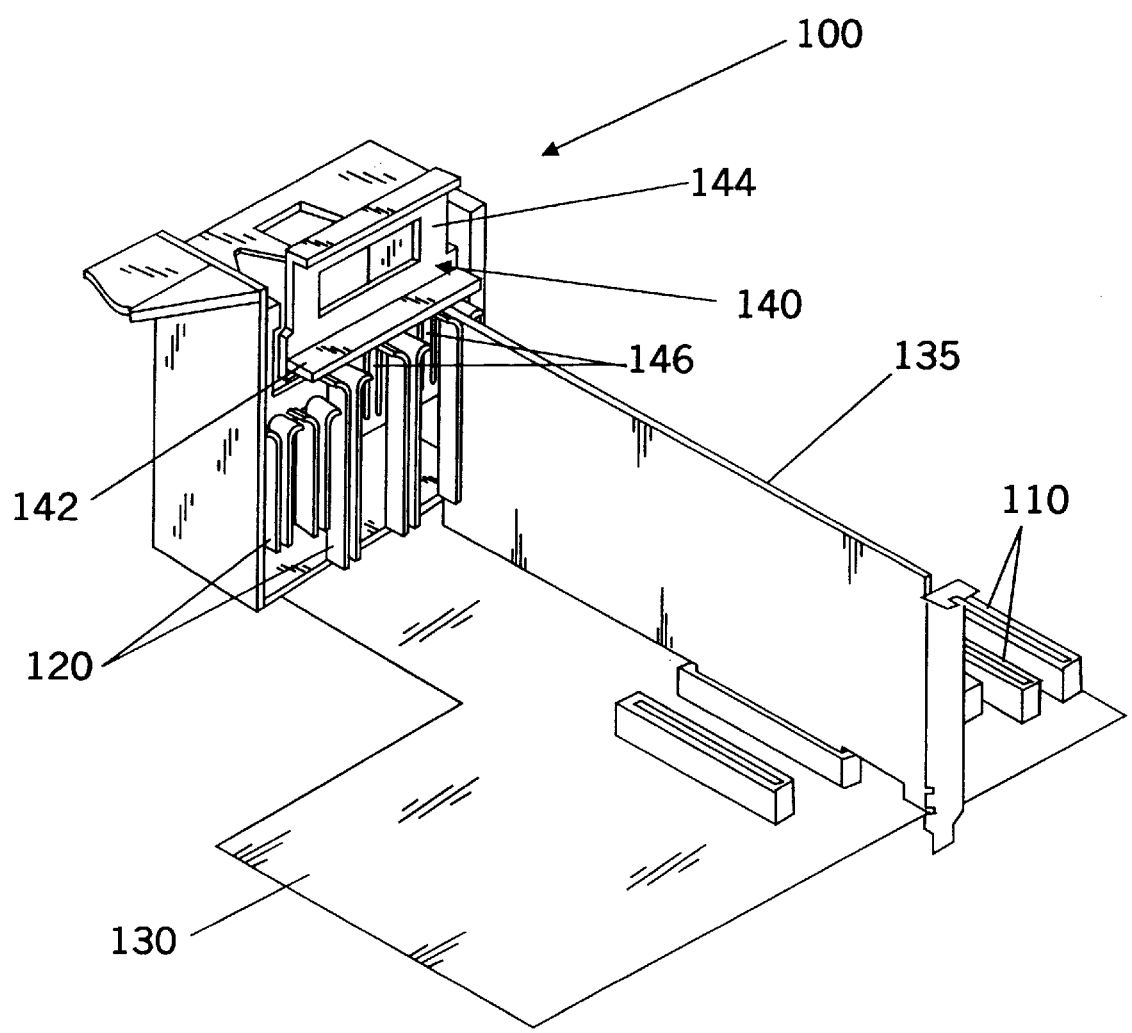
FIG. 1 is a rear, right upper perspective view showing a card lock according to the invention along with a fully inserted adapter card.

Referring now to FIG. 1, a frame 100, which is preferably molded as a single box-like structure with forward face open and rear face (toward card connectors 110) with card receiving guides 120 formed thereon. The frame 100 extends perpendicular to a circuit board 130 which supports the connectors 110 and is preferably molded of stiff but flexible plastic as one piece. A feature card 135 is shown in the fully inserted position in FIG. 1.

Figure 1A:
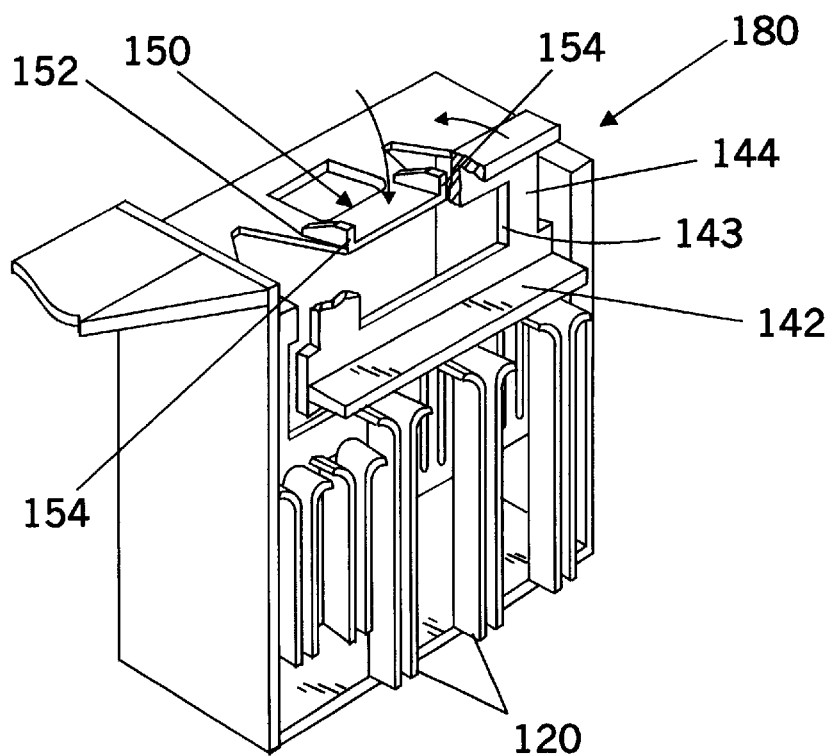
FIG. 1A is a rear, right, upper perspective view of a lock and guide complex with portions of the lock bar section cut away to emphasize the flexible retainer with blocking edges.
Figure 1B:
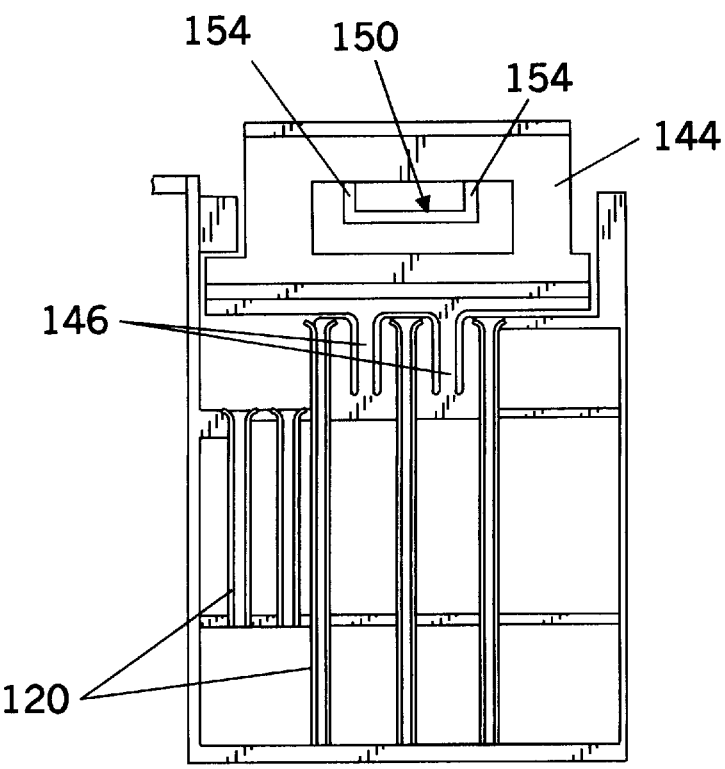
FIG. 1B is a plane view of the face of the support frame bearing the feature card guides.

A lock bar complex 140 (see FIG. 1A), according to the invention, is attached to the frame 100 (preferably all formed as sections of an overall unitary plastic moulding 180). The lock bar complex 140 (see also FIG. 1B) includes a lock bar 142, a handle section 144 and a flex section 146, which is preferably moulded as two slender elongate legs 148 capable of flexing out of a rest or normal position when pressure is applied at the handle section 144. A rib 145 is added to improve stiffness at the end of legs 148.

A dual function latch 150 is flexibly attached to the frame (preferably by narrowed legs 151) to extend toward the handle section 144 and includes first and second sets of blocking edges 152 and 154 respectively for controlling the position of the handle section 140. The handle section 140 preferably defines a latch opening by walls 143 through which latch extends for the open position of the latch bar assembly (more fully described below with reference to FIG. 3.

For the rest position of the lock bar complex 140 (see FIG. 2), the bar 142 is positioned above guides 120 to block card 135 from "riding up in its slot" so as to impair the connection at connector 110. According to the invention, the latch member 150 in its normal unflexed position (solid lines FIG. 2 where dashed lines indicate flexed position) presents edges 154 at the face of lock bar complex 140 opposite the face bearing the guides 120 and blocks movement to the open position.

Referring to FIG. 3, the lock bar complex is shown flexed position with latch 150 extending through the opening defined by walls 143 so as to latch the lock bar complex in the open position for convenient insertion and removal of cards 135 as indicated by dashed lines. This allows person servicing the system to remove cards using both hands as may be required to release or insert a card 135.

The release of the lock bar complex 140 to return to the normal or lock position is indicated in FIG. 4 where latch 150 is indicated in the flexed position to release at edge 152. The latch position is for reference indicated by dashed lines and upon return of the lock bar complex to the normal position the arrangement returns to that shown in FIG. 2.

The invention in a preferred form has been described in detail with reference to the drawings. It should be appreciated that various alternatives and variations will be suggested to those skilled in the art which are within the contemplation of the invention and reference should be had to the claims to determine the scope of the protected invention.

What is claimed is:

1. A card guide and locking frame for a personal computer which receives adapter cards comprising:

a rigid frame structure having at least one generally flat face with a card side facing away from the rest of the structure;

a plurality of card guide ribs arranged in pairs on the card side of said face, which pairs have a receiving end facing in a common direction;

a lock bar complex arranged adjacent the receiving end(s) of said guide rib pairs, which bar has a normal position blocking the receiving end of said guide pairs and is hinged to be deflectable to an open position toward the frame structure and removed from the receiving ends of the guide pair(s);

a flexible holding element connected to said frame having a first set of edges to engage and latch the bar complex in the open position, which holding element when deflected releases said lock bar to the normal position where the holding element abuts the bar complex at a second set of edges to block flexure from the normal position, whereby the bar complex is conveniently retained in the desired of open and blocking positions.

2. A card guide and locking frame according to claim 1 wherein the lock bar complex includes a handle section which defines a latching opening and the flexible holding element retains the lock bar complex in the open position by extending through the opening and engaging the handle section with said first set of edges.

3. A card guide and locking frame according to claim 1 wherein said lock bar complex is hinged by two flexible legs attached to said frame structure.

4. A card guide and locking frame according to claim 1 wherein said lock bar complex has a handle section and the holding element engages the lock bar element at the handle section to limit movement.

5. A card guide and locking frame according to claim 4 wherein the handle section defines an opening and the holding element extends through the opening to engage the bar complex in the open position.

\* \* \* \* \*